(12) United States Patent
Higashi et al.

(10) Patent No.: US 9,290,695 B2
(45) Date of Patent: Mar. 22, 2016

(54) METHOD FOR MANUFACTURING A THIN-FILM SEMICONDUCTOR DEVICE USING AN ETCHING SOLUTION FOR AN ALUMINUM OXIDE FILM

(71) Applicant: PANASONIC CORPORATION, Osaka (JP)

(72) Inventors: Hirofumi Higashi, Hyogo (JP); Yoshiharu Hidaka, Hyogo (JP)

(73) Assignee: JOLED INC, Tokyo (JP)

(*) Notice: Subject to any disclaimer, the term of this patent is extended or adjusted under 35 U.S.C. 154(b) by 0 days.

(21) Appl. No.: 14/401,599

(22) PCT Filed: Mar. 7, 2014

(86) PCT No.: PCT/JP2014/001268
§ 371 (c)(1),
(2) Date: Nov. 17, 2014

(87) PCT Pub. No.: WO2014/171054
PCT Pub. Date: Oct. 23, 2014

(65) Prior Publication Data
US 2015/0099327 A1    Apr. 9, 2015

(30) Foreign Application Priority Data

Apr. 19, 2013  (JP) ................ 2013-088574

(51) Int. Cl.
| | |
|---|---|
| *C23G 1/02* | (2006.01) |
| *C03C 25/68* | (2006.01) |
| *C09K 13/04* | (2006.01) |
| *H01L 29/786* | (2006.01) |
| *H01L 21/311* | (2006.01) |
| *C23G 1/12* | (2006.01) |
| *C09K 13/06* | (2006.01) |
| *H01L 21/441* | (2006.01) |
| *H01L 21/465* | (2006.01) |

(52) U.S. Cl.
CPC ............... *C09K 13/04* (2013.01); *C09K 13/06* (2013.01); *C23G 1/125* (2013.01); *H01L 21/31111* (2013.01); *H01L 21/441* (2013.01); *H01L 21/465* (2013.01); *H01L 29/786* (2013.01)

(58) Field of Classification Search
None
See application file for complete search history.

(56) References Cited

U.S. PATENT DOCUMENTS

| | | | | |
|---|---|---|---|---|
| 4,895,617 | A | * | 1/1990 | Roche et al. .................. 216/103 |
| 6,369,410 | B1 | | 4/2002 | Yamazaki et al. |

(Continued)

FOREIGN PATENT DOCUMENTS

| | | | | |
|---|---|---|---|---|
| CN | 1821447 | A | * | 8/2006 |
| JP | 61-111544 | | | 5/1986 |

(Continued)

OTHER PUBLICATIONS

Koski et al., "Properties of aluminium oxide thin films deposited by reactive magnetron sputtering" Feb. 8, 1999 Thin Solid Films Volume 339, Issues 1-2, pp. 240-248.*

(Continued)

*Primary Examiner* — Calvin Choi
*Assistant Examiner* — Xiaoming Liu
(74) *Attorney, Agent, or Firm* — Greenblum & Bernstein, P.L.C.

(57) ABSTRACT

An etching solution includes: phosphoric acid having concentration of 30% by weight to 80% by weight; nitric acid having concentration of 10% by weight or less; and surfactant having concentration of 0.0005% by weight to 0.0050% by weight, wherein the etching solution is used for etching an aluminum oxide film having film density of 2.80 g/cm³ to 3.25 g/cm³.

4 Claims, 9 Drawing Sheets

(56) References Cited

U.S. PATENT DOCUMENTS

| | | |
|---|---|---|
| 2006/0290747 A1 | 12/2006 | Shimada et al. |
| 2010/0311103 A1* | 12/2010 | Boukherroub ........ C23C 14/025 435/29 |
| 2011/0215328 A1 | 9/2011 | Morosawa et al. |
| 2011/0297930 A1* | 12/2011 | Choi et al. ..................... 257/43 |
| 2012/0112182 A1 | 5/2012 | Ishii et al. |

FOREIGN PATENT DOCUMENTS

| | | |
|---|---|---|
| JP | H04-506528 | 11/1992 |
| JP | 11-261074 | 9/1999 |
| JP | 2006-339635 | 12/2006 |
| JP | 2007-305996 | 11/2007 |
| JP | 2011-187506 | 9/2011 |
| JP | 2012-099757 | 5/2012 |
| JP | 2012-124192 | 6/2012 |
| WO | 90/13443 | 11/1990 |
| WO | 2005/028207 | 3/2005 |

OTHER PUBLICATIONS

International Search Report of Patent Application No. PCT/JP2014/001268 mailed May 13, 2014; along with an English Translation thereof.

* cited by examiner

FIG. 7

| Composition of etching solution | Etching rate of aluminum oxide film of Comparative example [nm/min] | Etching rate of aluminum oxide film of Example [nm/min] | Etching rate of silicon oxide film [nm/min] |
|---|---|---|---|
| Hydrogen fluoride having concentration of 20% by weight | 1.30 | — | >120.0 |
| Hydrochloric acid having concentration of 10% by weight | 0.00 | — | 0.0 |
| Phosphoric acid having concentration of 10% by weight | 0.00 | — | 0.0 |
| Phosphoric acid having concentration of 64% by weight and sulfuric acid having concentration of 25% by weight | 0.10 | — | 0.0 |
| Phosphoric acid having concentration of 64% by weight and hydrochloric acid having concentration of 5% by weight | 0.07 | — | 0.0 |
| Phosphoric acid having concentration of 64% by weight and nitric acid having concentration of 10% by weight | 0.00 | 9.75 | 0.0 |
| Phosphoric acid having concentration of 64% by weight and oxalic acid having concentration of 3% by weight | 0.02 | — | 0.0 |
| Potassium hydroxide having concentration of 10% by weight | 0.10 | — | 1.1 |

METHOD FOR MANUFACTURING A THIN-FILM SEMICONDUCTOR DEVICE USING AN ETCHING SOLUTION FOR AN ALUMINUM OXIDE FILM

TECHNICAL FIELD

The present invention relates to an etching solution for etching an aluminum oxide film, relates in detail to an etching solution for etching an aluminum oxide film having specific film density, and also relates to a method for manufacturing a thin-film semiconductor device using the etching solution.

BACKGROUND ART

In recent years, thin-film semiconductor devices have been widely used such as thin film transistors (TFTs) and thin-film solar batteries. A TFT includes, for example, a substrate, a gate electrode, a gate insulating film, a semiconductor layer, a source electrode, a drain electrode, a protection layer, and so on. Also, in order to improve carrier mobility in a semiconductor layer, development of TFTs has been proceeded using oxide semiconductor such as amorphous indium gallium zinc oxide (IGZO, InGaZnO).

By the way, when hydrogen intrudes into an oxide semiconductor layer, the oxide semiconductor layer is made to be conductive, and as a result a TFT might not function as a transistor. In response to this, it is effective to form, as a protection layer, a hydrogen protection film constituted from an aluminum oxide film so as to cover the oxide semiconductor layer.

In order to form wirings in a TFT, on the other hand, it is necessary to provide through-holes in the aluminum oxide film. Wet etching with use of an etching solution should be for example performed for providing through-holes in a thin film (Patent Literature 1).

CITATION LIST

Patent Literature

[Patent Literature 1] Japanese Patent Application Publication No. 2012-124192

SUMMARY OF INVENTION

Technical Problem

Generally, it is considered that an aluminum oxide film is difficult to etch with use of an etching solution containing phosphoric acid ($H_3PO_4$), hydrochloric acid (HCl), and so on. Accordingly, the aluminum oxide film is often etched with use of an etching solution containing hydrogen fluoride (HF). However, since hydrogen fluoride has high toxicity, the etching solution containing hydrogen fluoride is difficult to handle. On the other hand, as a result of consideration of hydrogen barrier properties of an aluminum oxide film, the present inventor found that an aluminum oxide film having specific film density can be etched. The present inventor conducted research and development in order to achieve an etching solution that ensures a practical etching rate of the aluminum oxide film having the specific film density, without using hydrogen fluoride.

The present invention aims to provide a practical etching solution achieved by the above findings of the present inventor.

Solution to Problem

One aspect of the present invention provides an etching solution comprising: phosphoric acid having concentration of 30% by weight to 80% by weight; nitric acid having concentration of 10% by weight or less; and surfactant having concentration of 0.0005% by weight to 0.0050% by weight, wherein the etching solution is used for etching an aluminum oxide film having film density of 2.80 $g/cm^3$ to 3.25 $g/cm^3$.

Advantageous Effects of Invention

With use of the above etching solution, it is possible to etch the aluminum oxide film having the film density of 2.80 $g/cm^3$ to 3.25 $g/cm^3$, without using hydrogen fluoride. Also, an etching rate of the aluminum oxide film having the above film density with use of the etching solution is a practical value.

BRIEF DESCRIPTION OF DRAWINGS

FIG. 7 is a table showing a relation between composition of an etching solution and an etching rate.

FIG. 9A shows a process of preparing a substrate above which a source electrode and a drain electrode are formed, FIG. 9B shows a process of layering protection film material and resist, and FIG. 9C shows a process of providing through-holes in a silicon nitride film.

FIG. 10A shows a process of providing through-holes in an aluminum oxide film, FIG. 10B shows a process of providing through-holes in a silicon oxide film, and FIG. 10C shows a process of forming extraction electrodes.

DESCRIPTION OF EMBODIMENTS

Figure 1:
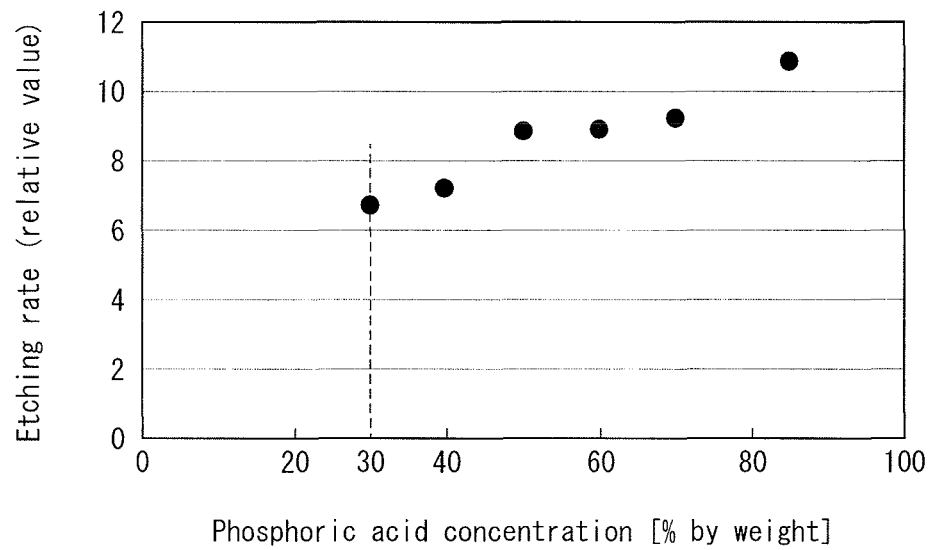
FIG. 1 is a graph showing a relation between phosphoric acid concentration in an etching solution and an etching rate of an aluminum oxide film.

One aspect of the present invention provides an etching solution comprising: phosphoric acid having concentration of 30% by weight to 80% by weight; nitric acid having concentration of 10% by weight or less; and surfactant having concentration of 0.0005% by weight to 0.0050% by weight, wherein the etching solution is used for etching an aluminum oxide film having film density of 2.80 g/cm$^3$ to 3.25 g/cm$^3$.

Also, according to the etching solution, the phosphoric acid may have concentration of 50% by weight to 70% by weight, and the nitric acid may have concentration of 2% by weight to 4% by weight.

One aspect of the present invention provides a manufacturing method of a thin-film semiconductor device, the manufacturing method comprising: forming an aluminum oxide film having film density of 2.80 g/cm$^3$ to 3.25 g/cm$^3$ above an oxide semiconductor layer; providing a through-hole in the aluminum oxide film by etching the aluminum oxide film with use of an etching solution, the etching solution including phosphoric acid having concentration of 30% by weight to 80% by weight, nitric acid having concentration of 10% by weight or less, and surfactant having concentration of 0.0005% by weight to 0.0050% by weight; and embedding, in the through-hole provided in the aluminum oxide film, an electrode to be electrically connected with the oxide semiconductor layer.

Also, according to the manufacturing method, the phosphoric acid may have concentration of 50% by weight to 70% by weight, and the nitric acid may have concentration of 2% by weight to 4% by weight.

Also, the manufacturing method may further comprise, between forming the aluminum oxide film and providing the through-hole in the aluminum oxide film: forming a protection film on the aluminum oxide film; providing a through-hole in the protection film by etching the protection film with use of fluorine-based gas; and performing plasma processing, with use of oxygen-based gas, on part of the aluminum oxide film that is exposed through the through-hole provided in the protection film.

Also, according to the manufacturing method, the protection film may have a single-layer structure consisting of any one of a silicon nitride film, a silicon oxide film, and a silicon oxynitride film, or a multi-layer structure consisting of at least two of the silicon nitride film, the silicon oxide film, and the silicon oxynitride film.

Embodiment 1

The following describes in detail Embodiment 1 with reference to FIG. 1 to FIG. 11.
<Outline>

An etching solution of Embodiment 1 is prepared from phosphoric acid having concentration of 30% by weight to 80% by weight, nitric acid having concentration of 10% by weight or less, surfactant having concentration of 0.0005% by weight to 0.0050% by weight, and water. This etching solution is utilizable for etching an aluminum oxide film having film density of 2.80 g/cm$^3$ to 3.25 g/cm$^3$. An etching rate of the aluminum oxide film having the above film density with use of the etching solution is a practical value. The following specifically describes composition of an etching solution and film density of an aluminum oxide film to be etched with use of the etching solution, with reference to FIG. 1 to FIG. 6.
<Composition of Etching Solution>
(1) Preferable Range of Phosphoric Acid Concentration The following describes the lower limit and the upper limit of the preferable range of phosphoric acid concentration "30% by weight to 80% by weight", with reference to FIG. 1 and FIG. 2.

First, consideration is made on the lower limit of the preferable range of phosphoric acid concentration. FIG. 1 shows a relation between phosphoric acid concentration in an etching solution and an etching rate of an aluminum oxide film. In the figure, the horizontal axis represents the phosphoric acid concentration, and the vertical axis represents a relative value of the etching rate. Note that respective etching solutions corresponding to plots are the same in terms of composition other than phosphoric acid concentration. The aluminum oxide film to be etched has film density of 2.80 g/cm$^3$ to 3.25 g/cm$^3$, and for example has film density of 2.9 g/cm$^3$.

When the phosphoric acid concentration is 30% by weight, 40% by weight, 50% by weight, 60% by weight, 70% by weight, and 85% by weight, the etching rate is 6.7, 7.0, 9.0, 9.0, 9.2, and 11.0, respectively. In this way, a positive correlation exists between the phosphoric acid concentration and the etching rate. When the phosphoric acid concentration is 30% by weight or more, a certain degree of the etching rate is ensured. Accordingly, the phosphoric acid concentration should preferably be 30% by weight or more. Note that an excessive low etching rate of the aluminum oxide film is unpractical because of increasing a time period necessary for etching the aluminum oxide film.

Figure 2:
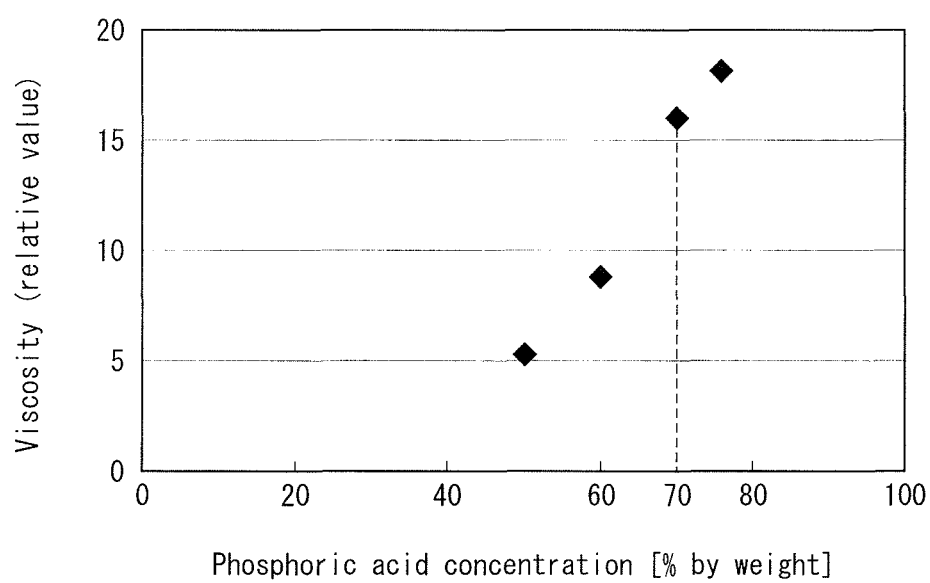
FIG. 2 is a graph showing a relation between phosphoric acid concentration in an etching solution and viscosity of the etching solution.

Next, consideration is made on the upper limit of the preferable range of phosphoric acid concentration. Generally, phosphoric acid used for an etching solution is often phosphoric acid that is marketed in a form of aqueous solution which is diluted with water. Phosphoric acid concentration in such marketed phosphoric acid aqueous solution is usually 80% by weight or less. Also, phosphoric acid having concentration of more than 80% by weight in an etching solution is unpractical because disposal of the etching solution increases environmental load. On the other hand, FIG. 2 shows a relation between phosphoric acid concentration in an etching solution and viscosity of the etching solution. In the figure, the horizontal axis represents the phosphoric acid concentration, and the vertical axis represents a relative value of the viscosity. Note that respective etching solutions corresponding to plots are the same in terms of composition other than phosphoric acid concentration. When the phosphoric acid concentration is 50% by weight, 60% by weight, 70% by weight, and 75% by weight, the viscosity of the etching solution is 5.5, 9.0, 16.0, and 18.0, respectively. In this way, a positive correlation exists between the phosphoric acid concentration and the viscosity of the etching solution. Accordingly, as the phosphoric acid concentration increases, the viscosity of the etching solution increases. By the way, if the viscosity of the etching solution increases too much, it is difficult to uniformly apply the etching solution to an aluminum oxide film through shower processing. If the etching solution is not uniformly applied, the aluminum oxide film might be ununiformly etched. In this way, there is a case where too high viscosity of the etching solution obstructs etching operations. Accordingly, the phosphoric acid concentration should preferably be 80% by weight or less.

Therefore, the phosphoric acid concentration in the etching solution should preferably be 30% by weight to 80% by weight.

Also, the phosphoric acid concentration in the etching solution should further desirably be 50% by weight to 70% by weight. This point is described below.

Returning to FIG. 1, when the phosphoric acid concentration is 50% by weight to 70% by weight, variation of the etching rate is small even when the phosphoric acid concentration varies. Accordingly, by designing the phosphoric acid concentration so as to be 50% by weight to 70% by weight, it is possible to suppress variation of the etching rate to a small degree, even if the phosphoric acid concentration varies each time an etching solution is prepared. As a result, a time period necessary for etching is constant, and this is practical.

Therefore, the phosphoric acid concentration in the etching solution should desirably be 50% by weight to 70% by weight.

(2) Preferable Range of Nitric Acid Concentration

The following considers the significance of addition of nitric acid to an etching solution and the upper limit of the preferable range of nitric acid concentration "10% by weight or less".

First, consideration is made on the significance of addition of nitric acid to an etching solution. In an etching solution containing phosphoric acid and nitric acid, the phosphoric acid mainly functions as acid, and the nitric acid functions as oxidant. By the way, in the case where aluminum oxide is etched with use of phosphoric acid, aluminum component in the form of $Al^{3+}$ is the most easily etched.

An aluminum oxide film having film density of 2.80 g/cm$^3$ to 3.25 g/cm$^3$ is considered to have the amorphous structure. It is considered that Al atom, $Al^+$, $Al^{2+}$, and so on exist on a contact interface between the aluminum oxide film having the above film density and an etching solution. Here, in the case where nitric acid is added to the etching solution used for etching the aluminum oxide film having the above film density, Al atom, $Al^+$, and $Al^{2+}$ tend to be oxidized to $Al^{3+}$ and as a result etching easily proceeds, compared with the case where an etching solution containing only phosphoric acid is used. Accordingly, nitric acid should preferably be added to an etching solution.

Next, consideration is made on the upper limit of the preferable range of nitric acid concentration. In the case where wet etching is performed using resist as a mask, nitric acid having concentration of more than 10% by weight tends to react with the resist, and as a result the resist might be damaged. For example in the case where the resist is made of epoxy resin, the resist is eluted due to the use of an etching solution containing nitric acid having concentration of more than 10% by weight. Accordingly, the nitric acid concentration in the etching solution should preferably be 10% by weight or less.

Also, the nitric acid concentration in the etching solution should further desirably be 2% by weight to 4% by weight. This point is described below.

Figure 4:
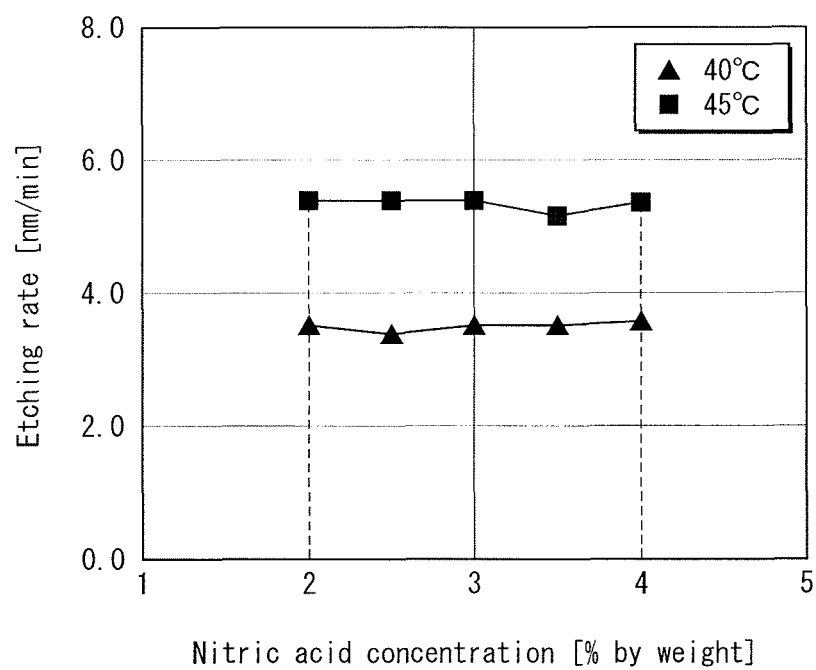
FIG. 4 is a graph showing a relation between nitric acid ($HNO_3$) concentration in an etching solution and an etching rate of an aluminum oxide film.

FIG. 4 is a graph showing a relation between nitric acid concentration and an etching rate. In the figure, the horizontal axis represents the nitric acid concentration, and the vertical axis represents the etching rate. Plots in triangle and rectangle shape each indicate an etching rate of an aluminum oxide film with use of an etching solution containing phosphoric acid having concentration of 60% by weight. The respective plots in triangle shape and rectangle shape differ from each other in terms of temperature of an etching solution, and correspond to 40 degrees C. and 45 degrees C., respectively. In the case where the etching solution has temperature of 40 degrees C., variation of the etching rate varies is small when the nitric acid concentration varies as long as the nitric acid concentration is 2% by weight to 4% by weight. The same applies to the etching solution having temperature of 45 degrees C. Accordingly, by designing the nitric acid concentration to be 2% by weight to 4% by weight, it is possible to suppress variation of the etching rate to a small degree, even if the nitric acid concentration varies each time an etching solution is prepared. As a result, a time period necessary for etching is constant, and this is practical.

(3) Preferable Range of Surfactant Concentration

It is preferable to add surfactant to an etching solution in order to improve wettability of an aluminum oxide film relative to the etching solution and thereby to appropriately perform etching. The following describes the lower limit and the upper limit of the preferable range of surfactant concentration in the etching solution "0.0005% by weight to 0.0050% by weight". Note that the surfactant may be any of anionic surfactant, cationic surfactant, and nonionic surfactant.

Figure 3:
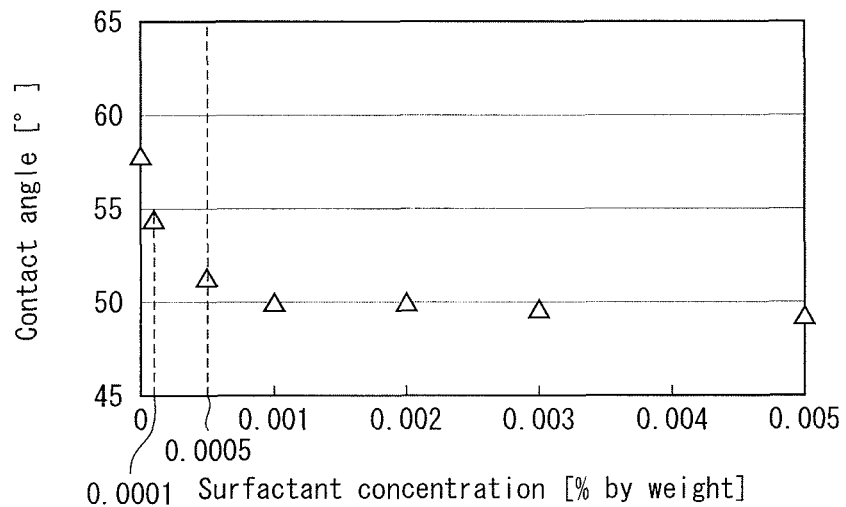
FIG. 3 is a graph showing a relation between surfactant concentration in an etching solution and a contact angle of the etching solution.

First, description is given on the lower limit of the preferable range of surfactant concentration. FIG. 3 is a graph showing a relation between surfactant concentration in an etching solution and a contact angle of the etching solution. In the figure, the horizontal axis represents the surfactant concentration, and the vertical axis represents the contact angle. Note that respective etching solutions corresponding to plots are the same in terms of composition other than surfactant concentration. The etching solution contains phosphoric acid having concentration of 60% by weight, nitric acid having concentration of 3% by weight, and nonionic surfactant.

When the surfactant concentration is 0.0000% by weight, 0.0001% by weight, 0.0005% by weight, 0.0010% by weight, 0.0020% by weight, 0.0030% by weight, and 0.0050% by weight, the contact angle is 58.0°, 54.0°, 51.0°, 50.0°, 50.0°, 49.5°, and 49.0°, respectively. By the way, in the case where wet etching is performed using resist in which an opening is provided as a mask, an etching solution having low wettability does not easily intrude into the opening provided in the resist. Accordingly, the contact angle should preferably be small to a certain degree. Therefore, the lower limit of the preferable range of surfactant concentration in the etching solution is determined as 0.0005% by weight that is a boundary value according to which the contact angle rapidly increases.

Next, consideration is made on the upper limit of the preferable range of surfactant concentration. A tendency is known that the higher surfactant concentration in an etching solution is, the more easily the etching solution foams. When the etching solution foams, a necessary amount of the etching solution is difficult to take from a reservoir, and a contact area of the etching solution in substantially contact with the aluminum oxide film decreases. In this way, bubbling of the etching solution might obstruct etching. In view of this, the present inventor performed an experiment in order to consider a relation between surfactant concentration in an etching solution and bubbling of the etching solution. First, five-type samples were made which differ in terms of surfactant concentration in an etching solution, namely 0.0000% by weight, 0.0010% by weight, 0.0050% by weight, 0.0100% by weight, and 0.1000% by weight. Note that the samples are the same in terms of composition other than surfactant concentration. The samples each contain phosphoric acid having concentration of 60% by weight, nitric acid having concentration of 3% by weight, and nonionic surfactant. After vibration of these five-type samples 50 times and placement of the samples in static state for 30 seconds, foaming of each etching solution was observed. Observation results demonstrated that when the surfactant concentration in the etching solution is 0.0100% by weight and 0.1000% by weight, the etching solution foams. Compared with this, the observation results also demonstrated that when the surfactant concentration in the etching solution is 0.0000% by weight, 0.0010% by weight, and 0.0050% by weight, the etching solution does not foam. Accordingly, the upper limit of the preferable range of the surfactant concentration was determined as 0.0050% by weight.

Therefore, the surfactant concentration in the etching solution should desirably be 0.0005% by weight to 0.0050% by weight.

(4) Film Density of Aluminum Oxide Film

By the way, it has been considered that in the case where an aluminum oxide film is used as a hydrogen protection film, it is necessary to improve film denseness. In order to improve denseness of the aluminum oxide film, it is considered that the aluminum oxide film should contain aluminum atom and oxygen atom in a stoichiometric ratio. As a result of consideration, however, the present inventor demonstrated that even an aluminum oxide film having film density of 2.80 g/cm$^3$ to 3.25 g/cm$^3$ can ensure hydrogen barrier properties. On the other hand, in order to etch the aluminum oxide film containing aluminum atom and oxygen atom in a stoichiometric ratio to provide through-holes in the aluminum oxide film, it has been necessary to use an etching solution containing hydrogen fluoride having high toxicity such as described above. However, the consideration of the present inventor demonstrated that it is possible to etch an aluminum oxide film having film density of 2.80 g/cm$^3$ to 3.25 g/cm$^3$ with use of an etching solution containing phosphoric acid having concentration of 30% by weight to 80% by weight, nitric acid having concentration of 10% by weight or less, and surfactant having concentration of 0.0005% by weight to 0.0050% by weight. The following describes the upper limit and the lower limit of the film density of the aluminum oxide film "2.80 g/cm$^3$ to 3.25 g/cm$^3$". The upper limit and the lower limit of aluminum oxide are determined in accordance with the etching rate and the hydrogen barrier properties, respectively.

Figure 5:
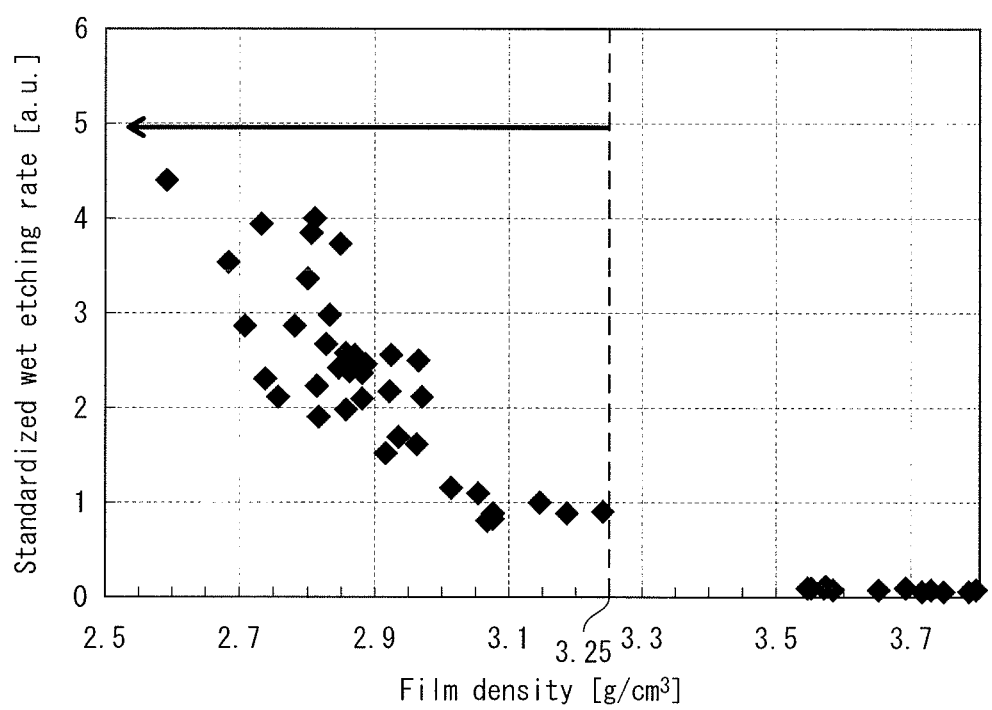
FIG. 5 shows a relation between a standardized etching rate of an aluminum oxide film and film density of the aluminum oxide film.

First, consideration is made on the etching rate of the aluminum oxide film. FIG. 5 shows a relation between a standardized etching rate of an aluminum oxide film and film density of the aluminum oxide film. The etching rate of an aluminum oxide film is desired to be high to a certain degree. Plots each correspond to any of a plurality of samples formed by various film formation methods such as an RF sputtering method, a DC sputtering method, and an EB vapor deposition method. In the case where an aluminum oxide film is formed by the sputtering method for example, a tendency is observed that as an oxygen flow rate increases, the film density decreases. In this way, the film density of an aluminum oxide film is considered to vary in accordance with film formation conditions. Note that it is difficult to normalize the variation tendency of the film density of the aluminum oxide film in accordance film formation conditions because the tendency is considered to differ between the film formation methods. In the figure, the vertical axis represents an etching rate standardized by an etching rate of a reference sample, and the horizontal axis represents film density calculated from results of X-ray reflectivity (XRR).

Here, reasons why the vertical axis represents the etching rate standardized by the etching rate of the reference sample are that the etching rate varies depending on concentration, type, and so on of an etching solution, and accordingly it is difficult to normalize the etching rate by describing an absolute value of the etching rate. In a wet etching process in which the etching rate of an aluminum oxide film depends on film density thereof, it is possible to obtain the same effects by adopting the film density described in the above method. Note that an etching rate of the reference sample with use of the etching solution of Embodiment 1 is approximately 1 nm/min to 50 nm/min.

The etching rate of the aluminum oxide film depends on the film density thereof. When the film density is 3.55 g/cm$^3$ or more, the etching rate is extremely low. Accordingly, the film density of the aluminum oxide film should be 3.25 g/cm$^3$ or less according to which the etching rate rapidly decreases.

Figure 6:
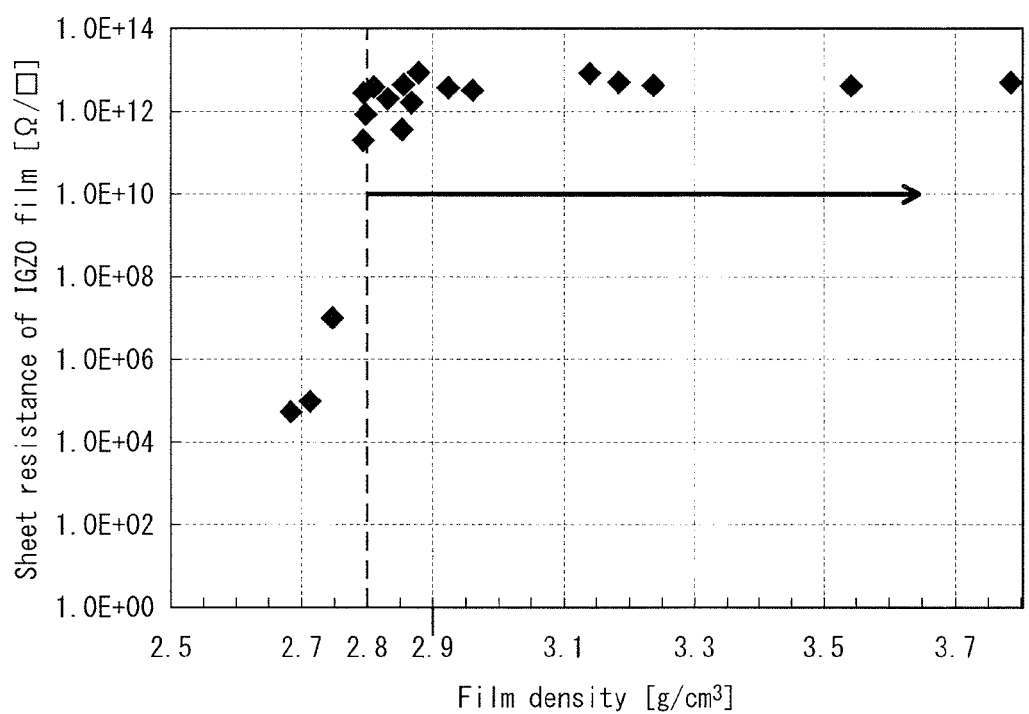
FIG. 6 shows a relation between sheet resistance of an oxide semiconductor layer and film density of an aluminum oxide film.

Next, consideration is made on hydrogen barrier properties of an aluminum oxide film. FIG. 6 shows a relation between sheet resistance of an IGZO film and film density of an aluminum oxide film. In the figure, the vertical axis represents the sheet resistance of the IGZO film, and the horizontal axis represents film density of the aluminum oxide film. Here, the sheet resistance of the IGZO film is used as an indicator indicating hydrogen barrier properties of the aluminum oxide film relative to an oxide semiconductor layer. In the case where the aluminum oxide film has no hydrogen barrier properties, the IGZO film is made to be conductive as described above. In other words, the sheet resistance of the IGZO film decreases. The sheet resistance of the IGZO film was measured by forming a metal electrode pattern on the IGZO film, forming a silicon oxide film and an aluminum oxide film, and then measuring sheet resistance on a sample that includes a protection film containing hydrogen. Note that a silicon nitride film formed by a plasma CVD method is used as the protection film containing hydrogen.

As shown in FIG. 6, when the film density of the aluminum oxide film as a second protection layer 7b is less than 2.80 g/cm$^3$, the sheet resistance of the IGZO film rapidly decreases. In other words, when the film density of the aluminum oxide film is 2.80 g/cm$^3$ or more, the hydrogen barrier properties of the aluminum oxide film relative to the IGZO film are ensured.

Accordingly, the aluminum oxide film, which can be etched with use of the etching solution of Embodiment 1 and ensure hydrogen barrier properties, has the film density of 2.80 g/cm$^3$ to 3.25 g/cm$^3$.

<Effects>

FIG. 7 is a table for explaining effects of the etching solution of Embodiment 1. In the figure, Comparative example is an aluminum oxide film having film density of 3.5 g/cm$^3$, Example is an aluminum oxide film having film density of 2.80 g/cm$^3$ to 3.25 g/cm$^3$, for example having film density of 3.0 g/cm$^3$. On the other hand, a silicon oxide film is generally used as an underlayer of an aluminum oxide film. Accordingly, even in the case where an etching rate of the aluminum oxide film is high, the underlayer might be etched together with the aluminum oxide film as long as an etching rate of the silicon oxide film is high, and therefore this is considered to be unpractical. Accordingly, consideration was made on practicality of an etching solution through measurement of the etching rate of the silicon oxide film in addition to the etching rate of the aluminum oxide film.

As shown in FIG. 7, the aluminum oxide film of Comparative example is etched with use of each of an etching solution containing hydrochloric acid having concentration of 10% by weight, an etching solution containing phosphoric acid having concentration of 10% by weight, and the etching solution of Embodiment 1 containing phosphoric acid having concentration of 70% by weight and nitric acid having concentration of 10% by weight. Respective etching rates with use of these etching solutions are each 0.00 nm/min. Also, the aluminum oxide film of Comparative example is etched with use of an etching solution containing phosphoric acid having concentration of 64% by weight and sulfuric acid having concentration of 25% by weight at an etching rate of 0.10 nm/min. Similarly, the aluminum oxide film of Comparative example is etched with use of an etching solution containing phosphoric acid having concentration of 64% by weight and hydrochloric acid having concentration of 5% by weight at an etching rate of 0.07 nm/min. The respective etching rates with use of these etching solutions are low. Furthermore, the aluminum oxide film of Comparative example is etched with use of an etching solution containing phosphoric acid having concentration of 64% by weight and oxalic acid having concentration of 3% by weight at an etching rate of 0.02 nm/min. Similarly, the aluminum oxide film of Comparative example is etched with use of an etching solution containing potassium hydroxide having concentration of 10% by weight at a low etching rate of 0.10 nm/min. The respective etching rates with use of these etching solutions are also low.

On the other hand, the aluminum oxide film of Comparative example is etched with use of an etching solution containing hydrogen fluoride having concentration of 20% by weight at a sufficiently high etching rate of 1.3 nm/min. However, since hydrogen fluoride has high toxicity, an etching solution containing hydrogen fluoride is difficult to handle. Also, the silicon oxide film as the underlayer is etched with use of the etching solution containing hydrogen fluoride having concentration of 20% by weight at a high etching rate of 120 nm/min. Accordingly, the etching solution containing hydrogen fluoride having concentration of 20% by weight is unpractical because the underlayer might be etched together with the aluminum oxide film.

Compared with this, the aluminum oxide film of Example is etched with use of the etching solution of Embodiment 1 containing phosphoric acid having concentration of 70% by weight and nitric acid having concentration of 10% by weight at a sufficiently high etching rate of 9.75 nm/min. Also, the silicon oxide film used as the underlayer is etched with use of the etching solution of Embodiment 1 at an etching rate of 0.0 nm/min. Therefore, the etching solution of Embodiment 1 containing phosphoric acid having concentration of 70% by weight and nitric acid having concentration of 10% by weight is practical because the underlayer cannot be etched together with the aluminum oxide film.

<Summary>

As described above, an aluminum oxide film having film density of 2.80 g/cm$^3$ to 3.25 g/cm$^3$ ensures hydrogen barrier properties. With use of the above etching solution of Embodiment 1, it is possible to have a practical value for an the aluminum oxide film having the film density of 2.80 g/cm$^3$ to 3.25 g/cm$^3$, without using hydrogen fluoride.

Embodiment 2

The following specifically describes etching processing on an aluminum oxide film with use of the etching solution of Embodiment 1, with reference to FIG. 8 to FIG. 10C.

<Configuration of Thin-Film Semiconductor Device>

Figure 8:
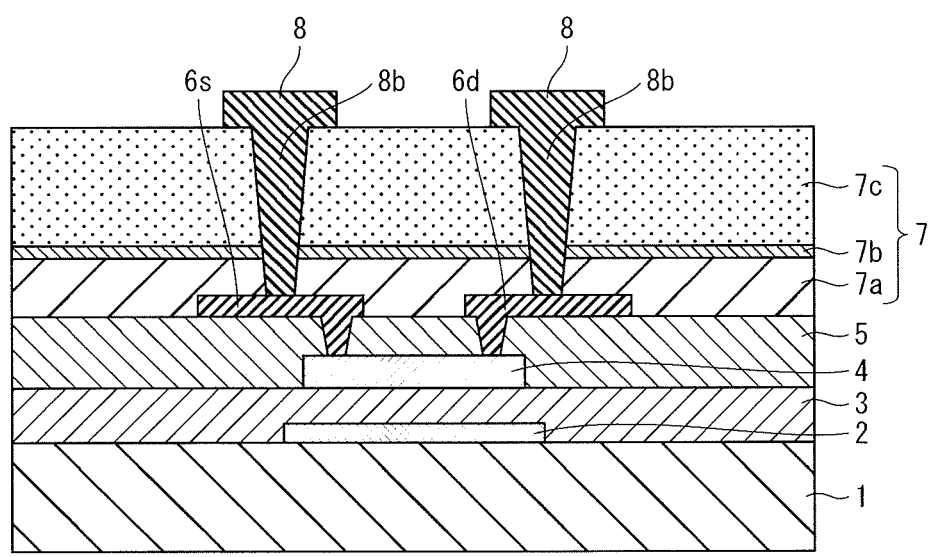
FIG. 8 is a cross-sectional view schematically showing a thin-film semiconductor device manufactured with use of an etching solution relating to Embodiment 1.

FIG. 8 is a cross-sectional view schematically showing a thin-film semiconductor device including an aluminum oxide film on which etching processing is to be performed.

A thin-film semiconductor device 10 includes a substrate 1, a gate electrode 2, a gate insulating film 3, an oxide semiconductor layer 4, a channel protection layer 5, a source electrode 6s, a drain electrode 6d, a protection layer 7, and extraction electrodes 8. The thin-film semiconductor device 10 is a bottom gate type TFT having a gate electrode provided on the lower side of a channel region. Also, the thin-film semiconductor device 10 is a channel protection type TFT, which is one type of bottom gate type TFTs, having a channel protection layer formed on a semiconductor layer. The thin-film semiconductor device 10, which is a channel protection type TFT, is capable of forming a thin oxide semiconductor layer containing a channel region. According to the thin-film semiconductor device 10, therefore, it is possible to reduce parasitic resistance due to the oxide semiconductor layer, thereby improving on-characteristics.

The following describes in detail the constitutional elements of the thin-film semiconductor device 10 relating to the present embodiment.

<Constitutional Elements of Thin-Film Semiconductor Device 10>

(Substrate 1)

The substrate 1 is a glass substrate made of glass material such as quartz glass, non-alkali glass, and highly heat-resistant glass. In order to prevent intrusion of impurities contained in the glass substrate such as sodium and phosphorus into the oxide semiconductor layer 4, an undercoat layer may be formed on the substrate 1 using silicon nitride film ($SiN_x$), silicon oxide ($SiO_y$), silicon oxynitride film ($SiO_yN_x$), or the like. The undercoat layer has film thickness of approximately 100 nm to 2000 nm for example.

(Gate Electrode 2)

The gate electrode 2 is formed on the substrate 1. The gate electrode 2 has the single-layer structure or the multi-layer structure consisting of conductive material and/or alloy thereof for example. The gate electrode 2 is for example made of molybdenum (Mo), aluminum (Al), copper (Cu), tungsten (W), titanium (Ti), chrome (Cr), and/or molybdenum-tungsten (MoW). Alternatively, the gate electrode 2 may be a light-transmissive conductive film made of indium tin oxide (ITO), aluminum-doped zinc oxide (AZO), gallium-doped zinc oxide (GZO), or the like. The gate electrode 2 has film thickness of approximately 200 nm to 500 nm for example.

(Gate Insulating Film 3)

The gate insulating film 3 is formed on the gate electrode 2. According to the thin-film semiconductor device 10, the gate insulating film 3 is formed over the entire substrate 1 so as to cover the gate electrode 2. The gate insulating film 3 has the single-layer structure, the multi-layer structure, or the like consisting of silicon oxide ($SiO_y$), silicon nitride ($SiN_x$), silicon oxynitride film ($SiO_yN_x$), aluminum oxide ($AlO_z$), tantalum oxide ($TaO_w$), and/or hafnium oxide ($HfO_x$). In the case where the gate insulating film 3 has the multi-layer structure, the two-layer structure consisting of a silicon oxide film and a silicon nitride film may be employed.

Since the oxide semiconductor layer 4 is used in the thin-film semiconductor device 10, the gate insulating film 3 should preferably contain silicon oxide. This point is described below. In order to maintain excellent threshold voltage properties of a TFT, it is preferable to put an interface between the oxide semiconductor layer 4 and the gate insulating film 3 in an excellent state. By using the gate insulating film 3 containing silicon oxide, which is oxide material like the oxide semiconductor layer 4, it is possible to put the interface between the oxide semiconductor layer 4 and the gate insulating film 3 in an excellent state. The gate insulating film 3 has film thickness of 50 nm to 300 nm for example.

(Oxide Semiconductor Layer 4)

The oxide semiconductor layer 4 is a semiconductor film which is formed on the gate insulating film 3, and has a channel region. The oxide semiconductor layer 4 is for example made of oxide semiconductor including at least one of indium (In), gallium (Ga), and zinc (Zn). As such oxide semiconductor, amorphous indium gallium zinc oxide (IGZO, InGaZnO) is used for example. The oxide semiconductor layer 4 has film thickness of approximately 20 nm to 200 nm for example.

(Channel Protection Layer 5)

The channel protection layer 5 is a protection film for protecting the channel region of the oxide semiconductor layer 4, and is formed over the entire oxide semiconductor layer 4 so as to cover the oxide semiconductor layer 4. The channel protection layer functions as a channel etching stopper (CES) layer for preventing the channel region of the oxide semiconductor layer 4 from being etched during etching processing for forming the source electrode 6s and the drain electrode 6d. If an oxide semiconductor layer is damaged due to etching, an oxygen-deficient layer is formed on a surface of the oxide semiconductor layer. Since such an oxygen-deficient layer has excessively high carrier concentration, the oxide semiconductor layer, which is damaged due to etching, is made to be conductive. Since a TFT in this state does not operate as a transistor, it is effective that a TFT using oxide semiconductor should have the structure in which a channel region of an oxide semiconductor layer is not damaged due to etching.

The channel protection layer 5 for example has the single-layer structure or the multi-layer structure consisting of silicon oxide, silicon oxynitride, aluminum oxide, and/or silicon nitride. The channel protection layer 5 has film thickness of 50 nm to 500 nm for example. The lower limit of the film thickness of the channel protection layer 5 is determined by suppressing influence of margin due to channel etching and fixed charge in the channel protection layer 5. Also, the upper limit of the film thickness of the channel protection layer 5 is determined by suppressing decrease in reliability of manufacturing process due to increase in level difference. Also, the channel protection layer 5 may be an organic material layer mainly containing organic material which includes silicon, oxygen, or carbon.

(Source Electrode 6s and Drain Electrode 6d)

The source electrode 6s and the drain electrode 6d are each formed above the channel region of the oxide semiconductor layer 4 via the channel protection layer 5. Also, the source electrode 6s and the drain electrode 6d are disposed facing each other with a space therebetween. Respective lower parts of the source electrode 6s and the drain electrode 6d are in contact with the oxide semiconductor layer 4, and thereby the source electrode 6s and the drain electrode 6d are electrically connected with the oxide semiconductor layer 4. In other words, when voltage is applied to the gate electrode 2, carriers move from the source electrode 6s and the drain electrode 6d to the oxide semiconductor layer 4.

According to the thin-film semiconductor device 10, the source electrode 6s and the drain electrode 6d each have the single-layer structure or the multi-layer structure consisting of conductive material and/or alloy thereof for example. The source electrode 6s and the drain electrode 6d are each for example made of aluminum, molybdenum, tungsten, copper, titanium, manganese (Mn), and/or chrome. According to the thin-film semiconductor device 10, the source electrode 6s and the drain electrode 6d each have the three-layer structure consisting of Mo/Cu/CuMn. The source electrode 6s and the drain electrode 6d each have film thickness of approximately 100 nm to 500 nm for example.

(Protection Layer 7)

The protection layer 7 is formed on the source electrode 6s and the drain electrode 6d. According to the thin-film semiconductor device 10, the protection layer 7 is formed over the entire the source electrode 6s and the drain electrode 6d so as to cover the source electrode 6s and the drain electrode 6d. The protection layer 7 has the three-layer structure consisting of a first protection layer 7a, a second protection layer 7b, and a third protection layer 7c. The first protection layer 7a should preferably be a film that has high adhesion with the source electrode 6s and the drain electrode 6d and contains a small amount of hydrogen therein. Accordingly, the first protection layer 7a is for example composed of a silicon oxide film. The second protection layer 7b should preferably be a film that has barrier properties against intrusion of hydrogen into the oxide semiconductor layer 4. Accordingly, the second protection layer 7b is composed of the aluminum oxide film having film density of 2.80 g/cm$^3$ to 3.25 g/cm$^3$ which is described in Embodiment 1. The third protection layer 7c should preferably be a film that has barrier properties against moisture and so on and ensures workability for providing through-holes in which the extraction electrodes 8 are to be embedded. Accordingly, the third protection layer 7c has the single-layer structure, the multi-layer structure, or the like consisting of a silicon nitride film, a silicon oxide film, and/or a silicon oxynitride film. The protection layer 7 has total film thickness of 200 nm to 1000 nm for example.

(Extraction Electrodes 8)

The extraction electrodes 8 are embedded in the through-holes provided in the protection layer 7. Also, respective lower parts 8b of the extraction electrodes 8 are in contact with the source electrode 6s and the drain electrode 6d, and thereby the extraction electrodes 8 are electrically connected with the source electrode 6s and the drain electrode 6d. Although not shown in the figure, the thin-film semiconductor device 10 includes an extraction electrode which is electrically connected with the gate electrode 2.

<Manufacturing Method of Thin-Film Semiconductor Device 10>

The following describes a manufacturing method of the thin-film semiconductor device 10, with reference to FIG. 9A to FIG. 10C. FIG. 9A to FIG. 10C are each a cross-sectional view showing a process of the manufacturing method of the thin-film semiconductor device 10 relating to Embodiment 1 of the present invention.

(Preparation Process of Substrate 1 Above which Source Electrode 6s and Drain Electrode 6d are Formed)

Figure 9A:
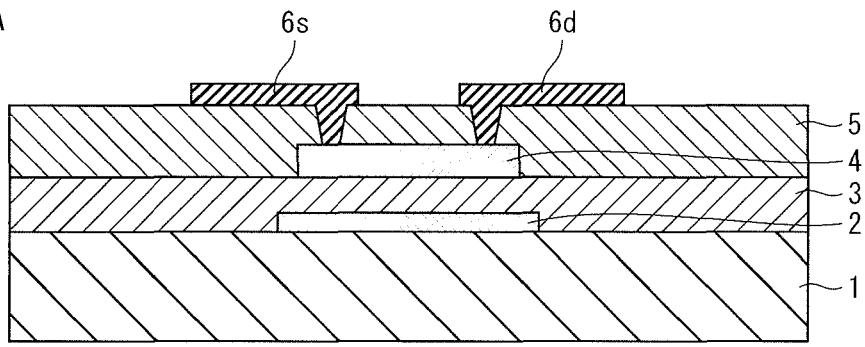
FIG. 9A to FIG. 9C are cross-sectional views schematically showing a manufacturing method of the thin-film semiconductor device shown in FIG. 8, where

As shown in FIG. 9A, a substrate 1 is prepared above which a source electrode 6s and a drain electrode 6d are formed. Specifically, a glass substrate is prepared as the substrate 1, and then a gate metal film is formed on the substrate 1 by the sputtering method. The gate metal film is composed of an Mo film and a Cu film that are layered in this order. Furthermore, the gate metal film is etched using resist as a mask by the wet etching method. As a result, a gate electrode 2 is formed. Wet etching of the Mo film and the Cu film is performed for example with use of an etching solution containing hydrogen peroxide ($H_2O_2$) and organic acid. Note that prior to formation of the gate electrode 2, an undercoat layer may be formed on the substrate 1 by a plasma chemical vapor deposition (CVD) method or the like, using a silicon nitride film, a silicon oxide film, a silicon oxynitride film, or the like.

Next, a gate insulating film 3 is formed by the plasma CVD method or the like so as to cover the gate electrode 2. The gate insulating film 3 is composed of a silicon nitride film and a silicon oxide film that are layered in this order. The silicon nitride film is formed for example by introducing silane ($SiH_4$) gas, ammonia ($NH_3$) gas, and nitrogen ($N_2$) gas. The silicon oxide is formed for example by introducing silane gas and nitrous oxide ($N_2O$) gas.

Furthermore, an oxide semiconductor layer 4 is formed on the gate insulating film 3. The oxide semiconductor layer 4 is for example composed of an IGZO film. Specifically, the IGZO film is formed by the sputtering method or the like. For example, an amorphous IGZO film is formed by performing sputtering on a target material with composition ratio of In:Ga:Zn=1:1:1 under an oxygen atmosphere. Furthermore, TFT properties are improved by performing thermal processing on the amorphous IGZO film at approximately 200 degrees C. to 500 degrees C. under an air atmosphere. The amorphous IGZO film is patterned by a photolithography method and the wet etching method. As a result, the oxide semiconductor layer 4 is formed. Wet etching of the IGZO film is performed for example with use of an etching solution containing phosphoric acid, nitric acid, acetic acid ($CH_3COOH$), and water.

After the oxide semiconductor layer 4 is formed, a channel protection layer 5, a source electrode 6s, and a drain electrode 6d are formed. Specifically, a silicon oxide film which is material of the channel protection layer 5 is formed by the plasma CVD method or the like so as to cover the oxide semiconductor layer 4. Then, the silicon oxide film is etched using resist as a mask by the dry etching method. As a result, the channel protection layer 5 is formed, which has provided therein a contact hole in each of respective regions functioning as a source region and a drain region on the oxide semiconductor layer 4. Dry etching of the silicon oxide film is performed by a reactive ion etching (RIE) device for example. Etching gas used for the dry etching is for example carbon tetrafluoride ($CF_4$) gas or oxygen ($O_2$) gas. Device parameters, such as gas flow rate, pressure, electrical power to be applied, and frequency, are appropriately set in accordance with the substrate size, the set etching film thickness, and so on. Next, the source electrode 6s and the drain electrode 6d are formed on the channel protection layer 5 in which the contact holes are provided. Specifically, a source-drain metal film is formed for example by the sputtering method on the channel protection layer 5 in which the contact holes are provided. The source-drain metal film is composed of an Mo film, a Cu film, and a CuMn film that are layered in this order. Furthermore, the source-drain metal film is etched using resist as a mask by the wet etching method. As a result, the source electrode 6s and the drain electrode 6d are formed. Wet etching of the Mo film, the Cu film, and the CuMn film is performed for example with use of an etching solution containing hydrogen peroxide ($H_2O_2$) and organic acid.

(Layering Process of Protection Layer Material 7' and Resist 9)

Figure 9B:
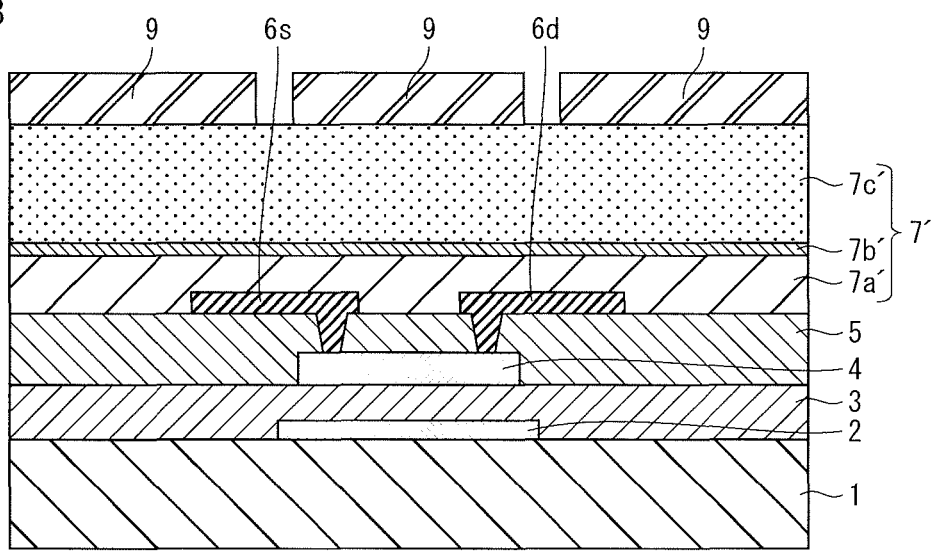

As shown in FIG. 9B, a protection layer material 7' and a resist 9 are layered so as to cover the substrate 1 above which the source electrode 6s and the drain electrode 6d are formed. Respective parts of the resist 9 that partially cover the source electrode 6s and the drain electrode 6d each have an opening provided therein. The protection layer material 7' is for example composed of a silicon oxide film, an aluminum oxide film, a silicon nitride film that are layered in this order. Specifically, the silicon oxide film constituting a first protection layer material 7a' is formed by the plasma CVD method or the like. The first protection layer material 7a' has film thickness of approximately 50 nm to 500 nm for example. The aluminum oxide film constituting a second protection layer material 7b' is layered for example by the sputtering method using a reactive sputtering device. Aluminum is used as a target, and argon (Ar) gas, oxygen ($O_2$) gas, or the like is used as process gas. Device parameters, such as gas flow rate, pressure, electrical power to be applied, and frequency, are appropriately set in accordance with the substrate size, the set film thickness, and so on. Note that aluminum oxide may be used as a target. In this case, argon gas is used as process gas. The second protection layer material 7b' has film thickness of approximately 2 nm to 50 nm for example. The silicon nitride film constituting a third protection layer material 7c' is formed by the plasma CVD or the like. The third protection layer material 7c' has film thickness of approximately 50 nm to 700 nm for example. The protection layer material 7' should preferably have total film thickness of approximately 300 nm to 700 nm in order to suppress the short between wirings and in consideration of level difference, and so on. The resist 9 is formed for example by layering resist material on the protection layer material 7' and then exposing the resist material by the photolithography method. The resist material is negative resist material, positive resist material, or the like. The resist 9 functions as a mask for use in dry etching and wet etching which are performed in processes shown below.

(Providing Process of Through-Holes in Third Protection Layer 7c)

Figure 9C:
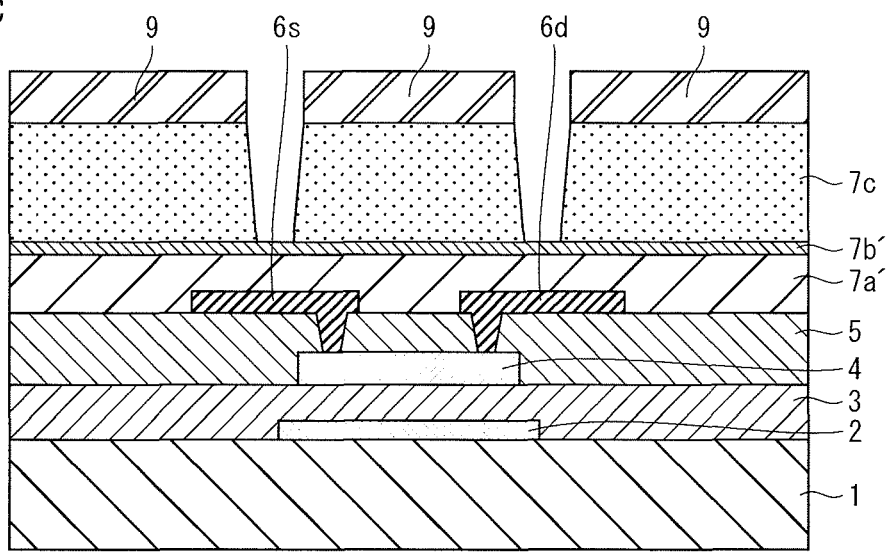

Then, as shown in FIG. 9C, a third protection layer 7c is formed in which through-holes are provided. Specifically, the silicon nitride film, which constitutes the third protection layer material 7c', is dry-etched. Dry etching of the silicon nitride film is performed by the RIE device for example. Etching gas used for the dry etching is for example sulfur hexafluoride ($SF_6$) gas and oxygen ($O_2$) gas.

(Providing Process of Through-Holes in Second Protection Layer 7b)

Figure 10A:
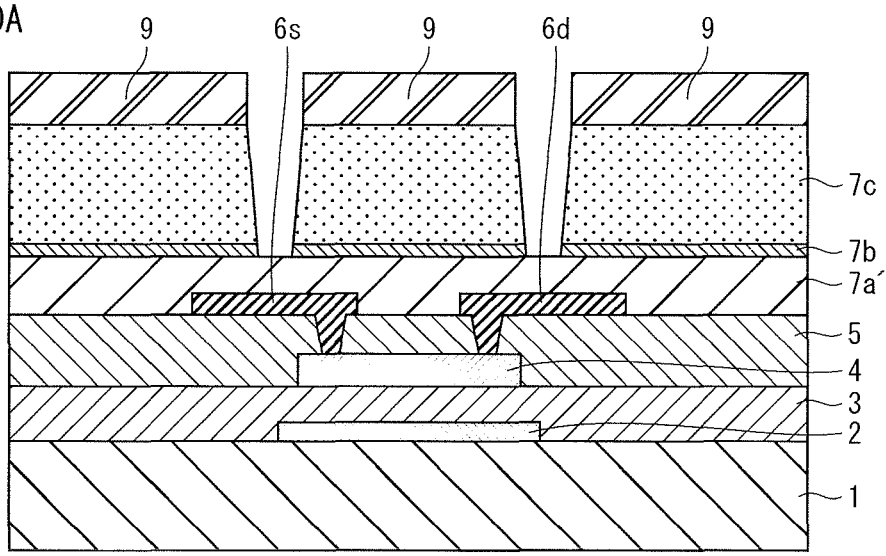
FIG. 10A to FIG. 10C are cross-sectional views schematically showing the manufacturing method of the thin-film semiconductor device shown in FIG. 8, where

Next, as shown in FIG. 10A, a second protection layer 7b is formed in which through-holes are provided. Specifically, an aluminum oxide film, which constitutes the second protection layer material 7b', is wet-etched. Wet etching of the aluminum oxide film is performed with use of the etching solution of Embodiment 1, for example an etching solution containing phosphoric acid having concentration of 30% by weight to 80% by weight, nitric acid having concentration of 10% by weight, surfactant having concentration of 0.0005% by weight to 0.0050% by weight, and water.

(Providing Process of Through-Holes in First Protection Layer 7a)

Figure 10B:
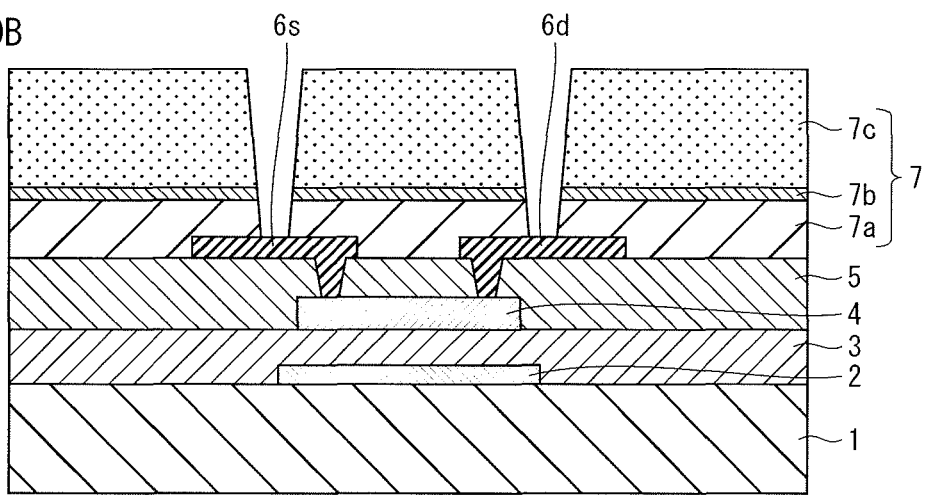

Furthermore, as shown in FIG. 10B, a first protection layer 7a is formed in which through-holes are provided. Specifically, a silicon oxide film, which constitutes the first protection layer material 7a', is dry-etched. Dry etching of the silicon oxide film is performed by the RIE device for example. Etching gas used for the dry etching is for example carbon tetrafluoride ($CF_4$) gas or oxygen ($O_2$) gas. Device parameters, such as gas flow rate, pressure, electrical power to be applied, and frequency, are appropriately set in accordance with the substrate size, the set etching film thickness, and so on.

Then, the resist 9 is removed, and as a result a protection layer 7 is formed in which through-holes are provided. The source electrode 6s and the drain electrode 6d are partially exposed through the through-holes provided in the protection layer 7. Note that resist removal should preferably be performed by a shower method. In the case where resist removal is performed with use of a removal solution, water washing process is necessary after resist removal. For example in the case where resist removal is performed by a dip method with use of a removal solution containing monoethanolamine, the monoethanolamine remaining on a surface of the protection layer 7 is converted to strongly-alkaline aqueous solution after being diluted with water in the subsequent water washing process. As a result, aluminum oxide might be etched. Therefore, in order to suppress etching of an aluminum oxide film due to dilution of a removal solution, resist removal should desirably be performed by a method according to which the removal solution remaining on the surface of the protection layer 7 is washed with water for a short time period, such as the shower method.

(Forming Process of Extraction Electrodes 8)

Figure 10C:
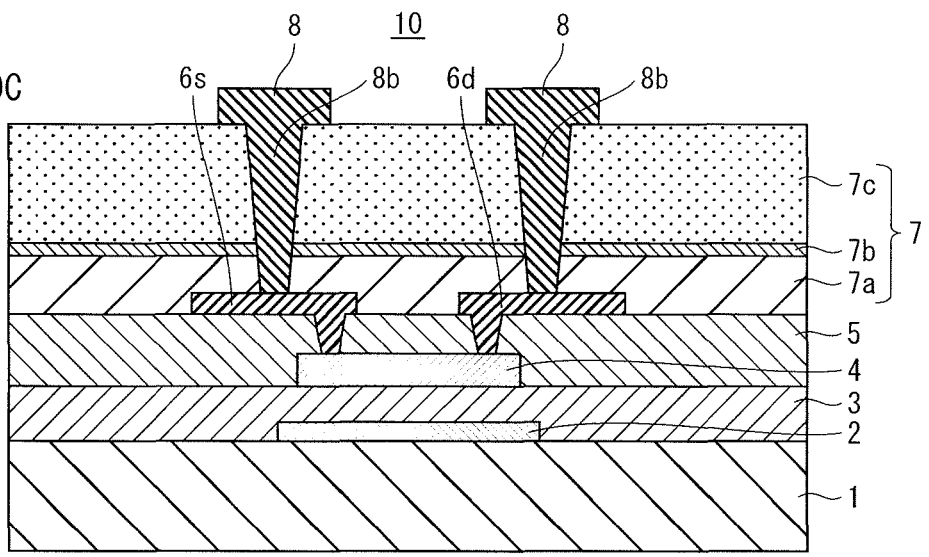

Finally, as shown in FIG. 10C, extraction electrodes 8 are formed on the protection layer 7. Specifically, an extraction metal film is formed by the sputtering method on the protection layer 7 in which the through-holes are provided. The extraction metal film is composed of an Mo film and a Cu film that are layered in this order. Furthermore, the extraction metal film is etched using resist as a mask by the wet etching method. As a result, the extraction electrodes 8 are formed. Wet etching of the Mo film and the Cu film is performed for example with use of an etching solution containing hydrogen peroxide ($H_2O_2$) and organic acid.

Through the above processes, it is possible to manufacture the thin-film semiconductor device 10 that includes the substrate 1, the second protection layer 7b, which is a hydrogen protection film, and the oxide semiconductor layer 4, which is provided between the substrate 1 and the second protection layer 7b. In the above example, the thin-film semiconductor device 10 includes the protection layer 7 having the three-layer structure. Alternatively, the number of layers included in the protection layer 7 may be changed as long as the second protection layer is included. For example, the protection layer 7 may have the two-layer structure consisting of the first protection layer and the second protection layer, the four-layer structure including the second protection layer composed of two layers, or the like.

Also, the above description has been given using an example of a TFT as a thin-film semiconductor device to be manufactured with use of the etching solution of Embodiment 1. However, there is no limitation to this, and a thin-film semiconductor device to be manufactured with use of the etching solution of Embodiment 1 may be any thin-film semiconductor device that includes an oxide semiconductor layer between a substrate and a hydrogen protection film in which through-holes are provided. The present invention is for example applicable to a thin-film solar battery that is composed of an oxide semiconductor layer sandwiched between two electrodes, and so on.

<Modifications>

1. Etching Process of Protection Film

In the above embodiments and so on, the through-holes are provided in the third protection layer by performing dry etching with use of sulfur hexafluoride ($SF_6$) gas and oxygen ($O_2$) gas. However, there is a case where the sulfur hexafluoride ($SF_6$) gas remains immediately after the through-holes are provided in the third protection layer by performing the dry etching. In such a case, the remaining sulfur hexafluoride ($SF_6$) gas fluorinates aluminum oxide on part of the second protection layer that is exposed through the through-holes, and the fluorinated aluminum oxide might be converted to $AlF_x$ or $AlF_aO_b$. If $AlF_x$ or $AlF_aO_b$ is wet-etched with use of an acid etching solution such as the etching solution of Embodiment 1, the etching rate might decrease. This might increase a time period necessary for providing the through-holes in the second protection layer. Wet etching of $AlF_x$ or $AlF_aO_b$ with use of the above etching solution might decrease the etching rate because fluorine is higher in terms of electronegativity than oxygen, and $AlF_x$ or $AlF_aO_b$ is a compound that is more stable than aluminum oxide.

In response to this case, it is possible to restore $AlF_x$ or $AlF_aO_b$ to aluminum oxide by performing plasma processing on an aluminum oxide film with use of oxygen-based gas after performing dry etching for providing the through-holes in the third protection layer. Specifically, first of all, inflow of sulfur hexafluoride ($SF_6$) gas is suspended in a chamber in which the third protection layer has been dry-etched. This allows to perform plasma processing, with use of only oxygen-based gas, on part of a surface of the aluminum oxide film which is exposed through the through-holes. Alternatively, plasma processing may be performed on the aluminum oxide film with use of oxygen-based gas in a chamber other than the chamber in which dry etching of the third protection layer has been performed. By performing plasma processing on the aluminum oxide film with use of oxygen-based gas, it is possible to etch the second protection layer with use of the etching solution of Embodiment 1 at an appropriate etching rate.

Figure 11:
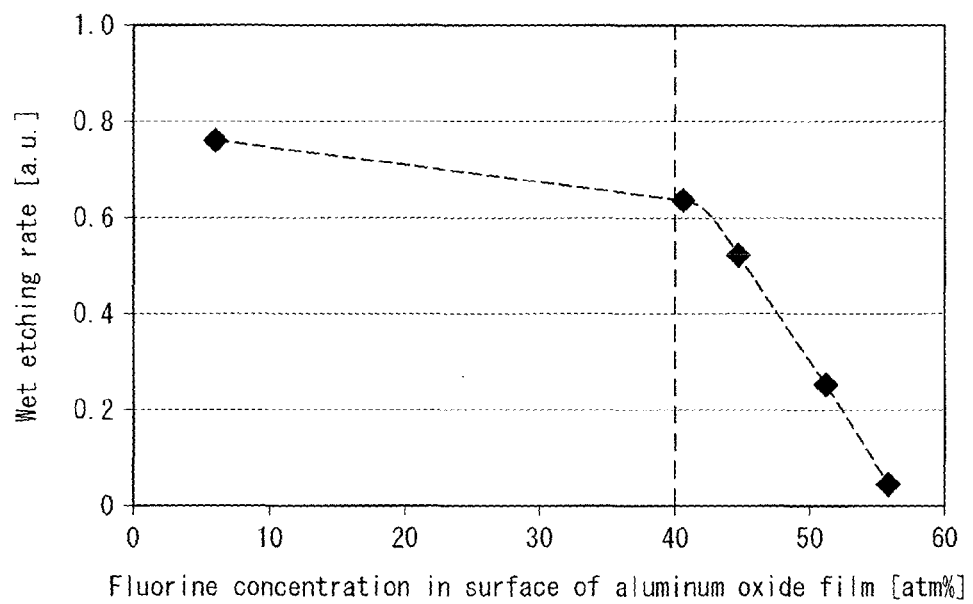
FIG. 11 is a graph showing a relation between fluorine concentration in a surface of an aluminum oxide film and a wet etching rate of the aluminum oxide film.

The following considers, with reference to a graph shown in FIG. 11, a fluorine concentration in a surface of an aluminum oxide film according to the aluminum oxide film can be wet-etched with use of the etching solution of Embodiment 1. In the figure, the horizontal axis represents fluorine concentration (atm/%) in a surface of an aluminum oxide film. The fluorine concentration indicates a ratio of fluorine atom to the sum of the fluorine atom, aluminum atom, and oxygen atom. Also, the vertical axis in the figure represents a wet etching rate of the aluminum oxide film. This wet etching rate indicates a ratio that is standardized based on definition that a wet etching rate with no dry etching is 1.0. In other words, the wet etching rate is a ratio that is standardized based on definition that when only an aluminum oxide film is formed, the aluminum oxide film is wet-etched at a wet etching rate of 1.0. Note that this wet etching is performed with use of an etching solution containing phosphoric acid having concentration of 60% by weight, nitric acid having concentration of 3% by weight, and surfactant having concentration of 0.0006% by weight.

As shown in the graph, when the fluorine concentration in the surface of the aluminum oxide film is 8 atm %, 41 atm %, 43 atm %, and 56 atm %, the wet etching rate is 0.78, 0.62, 0.52, and 0.04, respectively. In this way, when the fluorine concentration in the surface of the aluminum oxide film is more than 41 atm %, the wet etching rate rapidly decreases. Accordingly, when the fluorine concentration is 41 atm % or less, a wet etching rate is ensured. In other words, when the fluorine concentration in the surface of the aluminum oxide film is 41 atm % or less, it is possible to wet-etch the aluminum oxide film with use of the etching solution of Embodiment 1.

2. Others

In the above embodiments and so on, a thin-film semiconductor device is manufactured with use of the etching solution of Embodiment 1. However, a target to be manufactured with use of the etching solution of Embodiment 1 is not limited to a thin-film semiconductor device. Alternatively, in the case where a device needs to be manufactured through a process of etching an aluminum oxide film having film density of 2.80 g/cm$^3$ to 3.25 g/cm$^3$, the etching solution of Embodiment 1 may be used.

Also, the etching solution of Embodiment 1 may contain for example organic acid such as acetic acid, in addition to phosphoric acid, nitric acid, surfactant, and water.

INDUSTRIAL APPLICABILITY

The etching solution relating to the present invention is utilizable for etching of an aluminum oxide film included in various types devices.

Also, the thin-film semiconductor device relating to the present invention is widely utilizable for various types of electric equipment including display devices such as television sets, personal computers, and mobile phones, and other thin-film semiconductor devices.

REFERENCE SIGNS LIST 1 substrate
2 gate electrode
3 gate insulating film
4 oxide semiconductor layer
5 channel protection layer 6s source electrode
6d drain electrode
7 protection layer
7a first protection layer
7b second protection layer
7c third protection layer
8 extraction electrode
10 thin-film semiconductor device

The invention claimed is:

1. A manufacturing method of a thin-film semiconductor device, the manufacturing method comprising:
    forming an aluminum oxide film having film density of 2.80 g/cm$^3$ to 3.25 g/cm$^3$ above an oxide semiconductor layer;
    providing a through-hole in the aluminum oxide film by etching the aluminum oxide film with use of an etching solution, the etching solution including phosphoric acid having concentration of 30% by weight to 80% by weight, nitric acid having concentration of 10% by weight or less, and surfactant having concentration of 0.0005% by weight to 0.0050% by weight; and
    embedding, in the through-hole provided in the aluminum oxide film, an electrode to be electrically connected with the oxide semiconductor layer.

2. The manufacturing method of claim 1, wherein
    the phosphoric acid has concentration of 50% by weight to 70% by weight, and
    the nitric acid has concentration of 2% by weight to 4% by weight.

3. The manufacturing method of claim 1, further comprising, between forming the aluminum oxide film and providing the through-hole in the aluminum oxide film:
    forming a protection film on the aluminum oxide film;
    providing a through-hole in the protection film by etching the protection film with use of fluorine-based gas; and
    performing plasma processing, with use of oxygen-based gas and without fluorine-based gas, on part of the aluminum oxide film that is exposed through the through-hole provided in the protection film.

4. The manufacturing method of claim 3, wherein
    the protection film has a single-layer structure consisting of any one of a silicon nitride film, a silicon oxide film, and a silicon oxynitride film, or a multi-layer structure consisting of at least two of the silicon nitride film, the silicon oxide film, and the silicon oxynitride film.

\* \* \* \* \*